United States Patent [19]

Yukutake et al.

[11] Patent Number: 5,761,150
[45] Date of Patent: Jun. 2, 1998

[54] SYNCHRONOUS MEMORY WITH PIPELINED WRITE OPERATION

[75] Inventors: Seigoh Yukutake, Kodaira; Kinya Mitsumoto, Tamamura-machi; Takashi Akioka, Akishima; Masahiro Iwamura, Hitachi; Noboru Akiyama, Hitachinaka, all of Japan

[73] Assignee: Hitachi, Ltd., Tokyo, Japan

[21] Appl. No.: 651,873

[22] Filed: May 21, 1996

[30] Foreign Application Priority Data

May 24, 1995 [JP] Japan ................ 7-124709

[51] Int. Cl.$^6$ .................. G11C 8/00; G11C 7/00
[52] U.S. Cl. ............... 365/233; 365/189.12; 365/230.08; 365/194
[58] Field of Search ................ 365/233, 189.12, 365/194, 230.08

[56] References Cited

U.S. PATENT DOCUMENTS 5,587,961  12/1996  Wright et al. ................ 365/233

Primary Examiner—David C. Nelms
Assistant Examiner—Trong Phan
Attorney, Agent, or Firm—Antonelli, Terry, Stout, & Kraus, LLP

[57] ABSTRACT

There is provided a method of controlling an internal address signal of an RAM in which a late-write method is realized on a chip. Two sets of address registers for reading and writing are provided for each address and further a middle register is provided between the two sets of address registers. The middle register is controlled by a signal formed by obtaining the AND result of a clock signal and a write enable signal and the two sets of address registers for reading and writing are controlled only by the clock signal. A selection circuit selects outputs of the two sets of address registers as an input in accordance with the write enable signal to control an internal address.

6 Claims, 7 Drawing Sheets

SYNCHRONOUS MEMORY WITH PIPELINED WRITE OPERATION

BACKGROUND OF THE INVENTION

The present invention relates to a memory and, more particularly, to a synchronous memory.

The invention also relates to a method of controlling an address signal and a data signal of a synchronous memory.

The high processing speed of a SRAM for a cache is being improved in association with increases in the high processing speed of the system in which it is being used. A synchronous SRAM wherein the chip is synchronously operated internally by using a clock signal to realize a high processing speed is being employed nowadays.

Reading and writing operations will now be described for the synchronous SRAM of a register-register (R-R) type, in which registers are disposed in an input section and an output section, as an example.

The reading operation is executed in a manner such that a read address signal is received synchronously with a leading edge of a clock signal and data is read out from a memory cell selected by the received address, and the data which has already been read in the chip (a set-up is completed to an input of an output register) is outputted synchronously with a leading edge of a clock signal in the next cycle. The writing operation is executed in a manner such that the write address signal is received synchronously with a leading edge of a clock signal, and, write data also is received at the same timing. The write data received at the same timing is written to a memory cell selected by the received write address. As mentioned above, since the data which was already read out in the chip is outputted synchronously with the leading edge of the clock signal in the synchronous SRAM, there is an advantage in that the accessing time from the input of the clock signal until the data is output can be shortened and a next reading operation can be started before completion of a series of memory access operations (receiving of an address—reading out of data in the memory cell—output of the read data), and so the operation cycles can be processed at a high speed.

As will be obviously understood from the above description, however, a dead cycle is necessary between the read cycle and the write cycle in the operations of synchronous SRAMs.

As for read cycles, read data is outputted for a period of time from the middle of the second cycle from the leading edge of the clock signal, at which timing the address is received, to the middle of the third cycle. As for the write cycles, data and a control signal are received together with the address in response to the leading edge of the clock signal at which timing the address is received. When an interface is commonly used for both an input and an output (I/O common), two dead cycles are consequently necessary to execute the write cycle after the read cycle.

In a synchronous SRAM which operates synchronously with the clock signal as well, two or more dead cycles are necessary when the read cycle is switched to the write cycle in a conventional operation method of writing data received in the write cycle to the subsequent cycle (read cycle or write cycle), and the dead cycles limit the high speed processing by the system. As a method of decreasing the number of dead cycles and of improving the processing speed of the system, a method of realizing a late-write function wherein data is written to the memory cell in the next write cycle on the chip, has been proposed by IBM Corp. in the IBM 043611RLA and IBM041811RLA 1 Mb SRAMs.

To realize such a late-write function, there is a problem in that it is necessary to provide a circuit for holding a write address and write data until the next write cycle, and address signals in the chip are switched in the write cycle and the read cycle.

SUMMARY OF THE INVENTION

It is, therefore, an object of the present invention to provide a memory using a new method of controlling address signals in a chip using a late-write method for reducing dead time.

Another object of the invention is to provide a memory, such as a synchronous RAM, which eliminates a dummy cycle (or dead cycle: cycle in which an effective address is not received) existing between a read cycle and a write cycle, thereby improving the ratio of valid cycles of a memory, for example, a SRAM in which a write-back function is realized in a chip, or the like.

According to the present invention, the above objects are accomplished by a memory comprising: data holding means of (n) stages for receiving data from the outside (n) cycles after a write address is received and for holding the data; control means for shifting the data in the data holding means of (n) stages every write cycle; write address holding means of (n) stages for receiving a write address every write cycle and holding an address which is received first until a write cycle which is (n) cycles after the first write cycle; and control means for shifting the address in the write address holding means of (n) stages every write cycle and writing the data into a memory in a write cycle which is (n) cycles later.

According to another feature, there is also provided a memory in which an address register for a read cycle, an address register for a write cycle, and a delay circuit between the two sets of address registers are provided for each address, wherein an address signal is received in the read cycle address register at every cycle, a signal obtained by delaying an output signal of the read cycle address register is received in the write cycle address register at every write cycle, and the address signals received in the two sets of address registers are selected by a multiplexer circuit (MUX) to provide an internal address signal.

According to another feature, there is also provided a memory in which an address register for a read cycle, an address register for a write cycle, and a middle address register between the two sets of address registers are provided for each address, wherein an address signal is received in the read cycle address register at every cycle, an output signal of the read cycle address register is received in the middle address register at every write cycle, an output signal of the middle address register is received in the write cycle address register at every cycle, and the address signals received in two sets of the address registers are selected by a multiplexer circuit (MUX) to provide an internal address signal.

Further, according to the invention, there is provided a memory in which one set of an address register for reading (1st address register), two sets of address registers for writing (2nd address register and 3rd address register), and a set-up means for an address signal at the front stage of the 2nd address register and the 3rd address register are provided for each address, wherein the 2nd address register receives an address to be written in a write cycle after next, the 3rd address register receives an address to be written in the next write cycle, and the address signals received in the 1st address register and the 3rd address register are selected by a multiplexer circuit (MUX) to provide an internal address signal.

According to still another feature of the invention, there is provided a memory in which a set-up means for write data and a register for write data are provided for write data, the write data is received in the set-up means for write data two cycles after a cycle in which a write address is received and data of the set-up means for write data is received in the register for write data at every cycle subsequent to a write cycle.

The invention is characterized in that a timing of the data supply to the register for write data is behind a timing when the data supply to the set-up means for write data is completed.

With such featured aspects of the present invention, since as described hereinabove, in which the write address is held in the chip until the next write cycle, the internal address signal in the write cycle can be controlled.

A middle address register is provided and the write address is preliminarily set-up for an input of the address register for a write cycle, thereby enabling the address register for a read cycle and the address register for a write cycle to be controlled by the same clock signal and the register to be controlled at a predetermined timing, so that the internal address can be produced at a high speed.

Further, since two-hierarchy means for holding the write address and write data are provided, an address and write data regarding the next write cycle and an address and write data regarding a cycle after the next cycles can be held and the write data can be received two cycles after the cycle in which the write address is received, so that a dead cycle between the read cycle and the write cycle can be eliminated.

Thus, a high processing speed for the synchronous memory can be realized.

DESCRIPTION OF THE PREFERRED EMBODIMENTS

Embodiments of the invention will be described hereinbelow with reference to the drawings.

Figure 1:
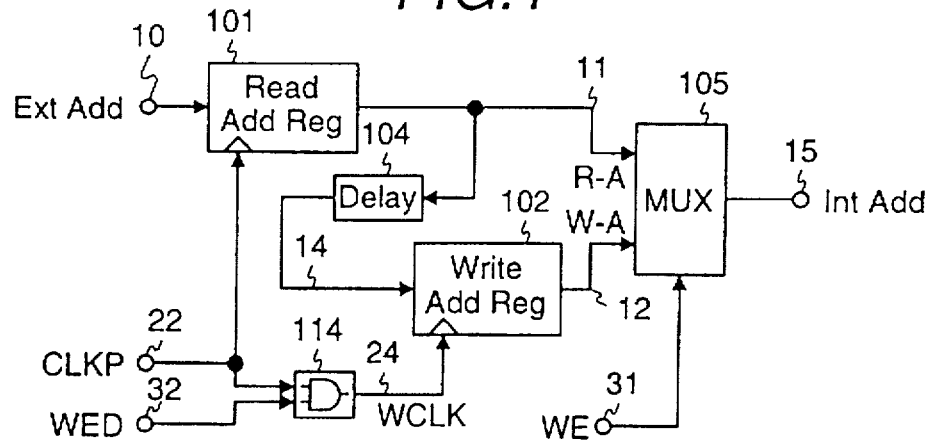
FIG. 1 is a block diagram of an address signal control circuit according to the invention using a late-write method.

FIG. 1 is a block diagram of a circuit for carrying out an address signal control method according to the invention using a late-write operation. Reference numeral 10 denotes an address signal input terminal for supplying an external input address signal to a read address register 101 which is controlled by an internal clock signal (CLKP) 22. The register 101 generates a read address signal (R-A) 11 which is supplied to a selection circuit (MUX) 105 and to a write address register 102 through a delay circuit 104. The write address register 102 is controlled by a clock signal formed by effecting the AND logic operation result between the internal clock signal 22 and a write enable system signal (WED) 32, that is, a write register control clock signal (WCLK) 24, and outputs a write address signal (W-A) 12 which is transferred to the selection circuit (MUX) 105. The selection circuit (MUX) 105 selects the read address signal 11 at the time of a reading operation and the write address signal 12 at the time of a writing operation in accordance with a write enable signal (WE) 31 and outputs an internal address signal 15.

Figure 2:
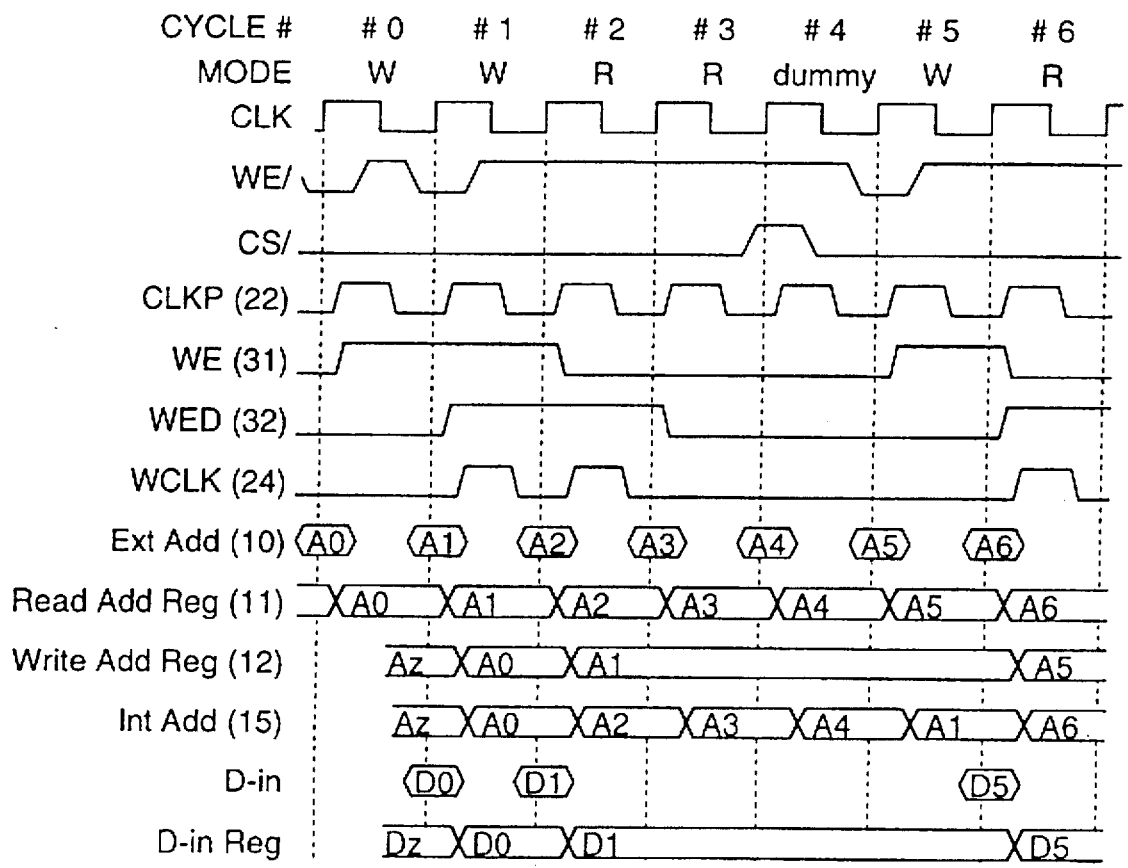
FIG. 2 is a timing chart for explaining the operation of FIG. 1.

FIG. 2 is a timing chart showing receiving and switching operations of the address signals when a late-write operation is executed, for explaining the internal operation of the embodiment of FIG. 1 in detail. In a cycle #0, a write enable bar (WE/) signal is set to the "Lo" (low) level, so that a write cycle is indicated. An external input address signal of the cycle (a signal inputted to the terminal 10) is "AO". Data "D0" to be received in the subsequent cycle will be written to a memory cell indicated by the address "AO" in the next write cycle. An address "Az" has been received in the previous cycle and is now held in the write address register 102 and data "Dz" has been received in a data input register (not shown). In the cycle "#0", the selection circuit 105 selects the write address signal 12 in response to the "Hi" (high) level of the write enable signal (WE) 31 and controls the internal address signal to "Az". The operation to write the data "Dz" from the data input register into the memory cell selected by "Az" is consequently executed.

A cycle "#1" is successively a write cycle and the address signal input terminal 10 receives an address signal "A1". In response to a leading edge of the internal clock signal 22, the address signal "A1" is supplied to the read address register 101. In response to a leading edge of the clock signal (WCLK) 24 formed by obtaining the AND result between the internal clock signal 22 and the write enable system signal (signal in which the state of the previous cycle is held) (WED) 32, the address signal "AO" obtained by delaying the read address register output signal 11 is supplied to the write address register 102. The data "D0" is supplied to the data input register. The selection circuit 105 selects the write address signal 12 in response to the "Hi" state of the write enable signal (WE) 31 and controls the internal address signal to "AO". In this cycle, the data "D0" is consequently written to the memory cell selected by "D0".

A subsequent cycle "#2" is a read cycle since WE/ is set to "Hi". The address input terminal 10 of the cycle receives address signal "A2". In response to the leading edge of the internal clock signal 22, the address signal "A2" is supplied to the read address register 101. In response to the leading edge of the clock signal (WCLK) 24 formed by obtaining the AND result between the internal clock signal 22 and the write enable system signal (signal in which the state of the previous cycle is held) (WED) 32, the address signal "A1" obtained by delaying the read address register output signal 11 is supplied to the write address register 102 and the data "D1" is supplied to the data input register. In response to the switching of the write enable signal 31 from "Hi" to "Lo", the selection circuit 105 selects the read address signal 11 and controls the internal address signal to "A2". In the cycle, data is consequently read from the memory cell selected by address "A2".

A cycle "#3" is subsequently a read cycle and the address signal input terminal 10 receives address signal "A3". The read address register 101 receives the address signal "A3". Since the write enable system signal (WED) 32 is set to "Lo", the clock signal (WCLK) 24 generates no clock pulse and the write address register 102 does not receive a new address but holds the address "A1". The data input register similarly does not receive a new address but holds the data "D1". In response to the "Lo" state of the write enable signal (WE) 31, the selection circuit 105 selects the read address signal 11 and controls the internal address signal to "A3". In the cycle, data is consequently read from the memory cell selected by "A3".

A cycle "#4" becomes a dummy cycle in accordance with a chip select bar signal (CS/). Although it is assumed that data is read out from a memory cell selected by an address signal "A4" in the embodiment, an output buffer or the like (not shown) is controlled to be disabled and an output is controlled to a Hi-impedance for a period of time from the middle of a subsequent cycle "#5" to the middle of a cycle #6. The clock signal (WCLK) 24 generates no clock pulse and the address "A1" and the data "D1" are held in the write address register 102 and the data input register, respectively.

The subsequent cycle "#5" is a write cycle since both of CS/ and WE/ are set to the "Lo" state. The address signal input terminal 10 receives an address signal "A5" in the cycle. Data "D5" to be received in the subsequent cycle will be written to a memory cell selected by the address "A5" in the next write cycle. The address "A1" has been held in the write address register 102 and the data "D1" has been held by the data input register since the previous write cycle. In the cycle "#5", in response to the "Hi" state of the write enable signal (WE) 31, the selection circuit 105 selects the write address signal 12 and controls the internal address signal to "A1". Consequently, the data "D1" is written to the memory cell selected by address "A1". Operations in a cycle "#6" and subsequent cycles will be understood from the above description of the operations.

According to the embodiment, the write address is supplied to the write address register in the cycle next to the write cycle in which it was received and a new address is not supplied to the write address register in the read and dummy cycles, so that the address signal in the previous write cycle can be held during read operations until the next write cycle, thereby enabling the late-write operation to be realized on the chip.

Figure 3:
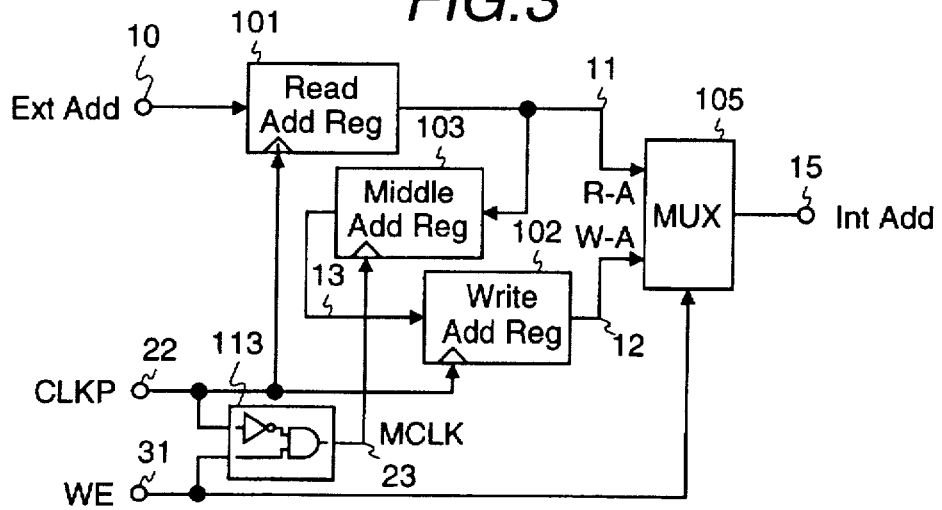
FIG. 3 is a block diagram of another address signal control circuit according to the invention using the late-write method.

FIG. 3 shows a block diagram of another example of an address signal control circuit for realizing the late-write function of the invention on a chip.

The main difference in construction between this example and the circuit of FIG. 1 will be described. In FIG. 3, a middle register 103 is provided between the read address register 101 and the write address register 102 in place of the previously used delay circuit. The middle register 103 receives the write address signal outputted from the read address register 101 and transfers the output to the write address register 102. The middle register 103 is controlled by a middle register clock signal (MCLK) 23 formed by obtaining the AND result between an inversion signal of the internal clock signal (CLKP) 22 and the write enable signal (WE) 31. Both of the read address register 101 and the write address register 102 are controlled by the internal clock signal (CLKP) 22 and outputs of the registers are transferred to the selection circuit (MUX) 105.

Figure 4:
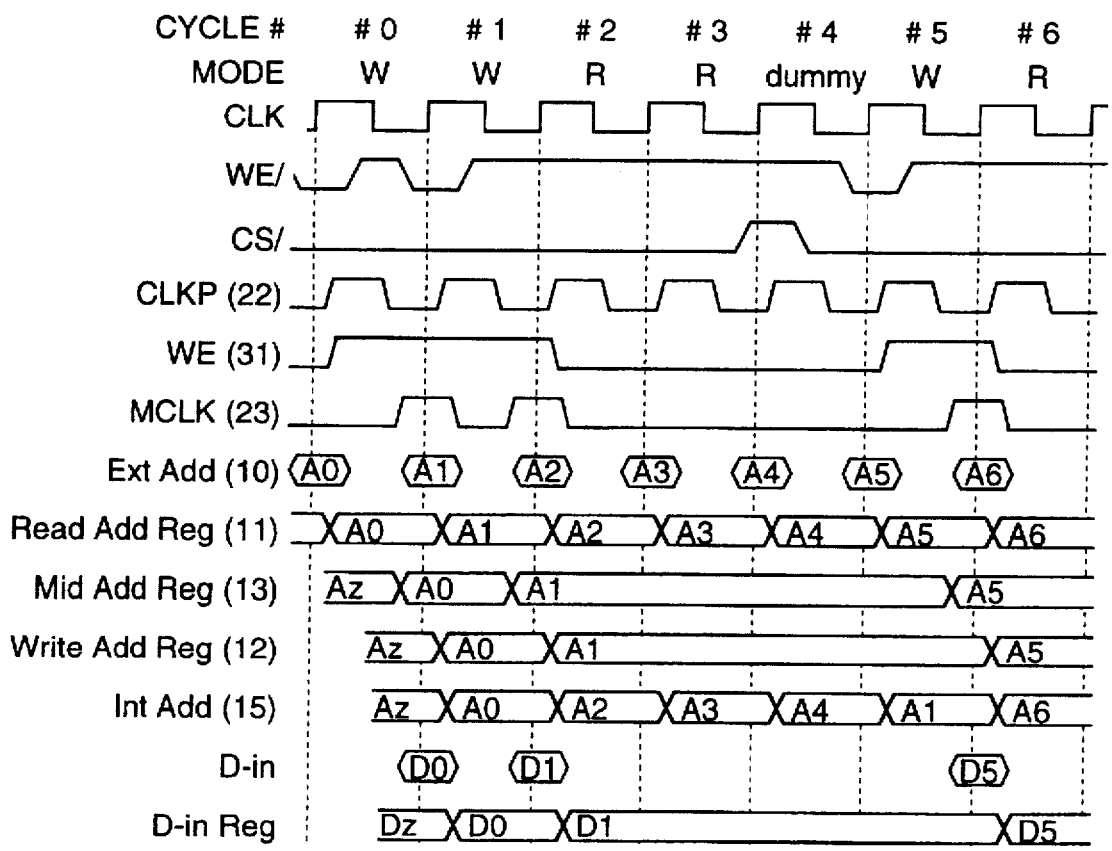
FIG. 4 is a timing chart for explaining the operation of FIG. 3.

FIG. 4 is a timing chart showing receiving and switching operations of the address signal when a late-write operation is executed, for explaining the internal operation. The input signals supplied from outside of the chip are the same as those shown in FIG. 2.

The cycle #0 is a write cycle. The external input address 10 is "A0" in the cycle. The address "Az" has been held in the middle register 103 since the previous cycle. In response to the leading edge of the internal clock signal (CLKP) 22, the read address register 101 and the write address register 102 receive the address from "A0" from the address signal input terminal 10 and the address "Az" as an output 13 of the middle register 103, respectively. The selection circuit 105 selects the address "Az" of the write address register 102 on line 12. The data "Dz" has been held in the data input register (not shown). The data "Dz" is, therefore, written to the memory cell selected by the address "Az" in the cycle #0. The middle register clock signal (MCLK) 23 in the write cycle rises in response to the trailing edge of the internal clock signal 22 and trails in response to the leading edge of the signal 22 in the next cycle. The middle register 103 receives the address "A0" as an output 11 of the read address register 101 in response to a leading edge of the middle register clock signal (MCLK) 23 in the latter half of the write cycle.

The cycle "#1" is successively a write cycle. The address signal input terminal 10 in the cycle "#1" receives the address "A1". The address "A0" taken in the latter half of the previous cycle "#0" has been held in the middle register 103. In response to the leading edge of the internal clock signal (CLKP) 22, the read address register 101 and the write address register 102 receive the address "A1" from the address signal input terminal 10 and the address "A0" as an output 13 of the middle register 103, respectively. The selection circuit 105 selects the address "A0" of the write address register 102 on line 12. The data "D0" is supplied to the data input register (not shown) in the cycle. The data "D0" is, therefore, written to the memory cell selected by the address "A0" in the cycle "#1". The middle register 103 receives the address "A1" of the output 11 of the read address register 101 in response to the middle register clock signal (MCLK) 23.

The subsequent cycle "∩2" is a read cycle. The address signal input terminal 10 receives the address "A2" in this cycle. The address "A1" taken in the latter half of the previous cycle "#1" has been held in the middle register 103. In response to the leading edge of the internal clock signal (CLKP) 22, the read address register 101 and the write address register 102 receive the address "A2" from the address signal input terminal 10 and the address "A1" as an output 13 of the middle register 103, respectively. By selecting the address "A2" of the read address register 101 on line 11, the selection circuit 105 reads data from the memory cell selected by address "A2" in the cycle "#2". Since the write enable signal (WE) 31 is set to the "Lo" state, the middle register clock signal (MCLK) 23 generates no clock pulse. Consequently, the address "A1" is successively held in the middle register 103. The data "D1" is supplied to the data input register (not shown) in the cycle "#2".

The cycle "#3" is successively a read cycle. The address signal input terminal 10 receives the address "A3" in this cycle. The address "A1" received in the previous write cycle has been held in the middle register 103. In response to the leading edge of the internal clock signal (CLKP) 22, the read address register 101 and the write address register 102 receive the address "A3" from the address signal input terminal 10 and the address "A1" as an output 13 of the middle register 103, respectively. By selecting the address "A3" of the read address register 101 on line 11, the selection circuit 105 reads data from the memory cell selected by address "A3" in the cycle. In a manner similar to the previous cycle, the middle register clock signal (MCLK) 23 generates no clock pulse. Consequently; the address "A1" is successively held in the middle register 103. The data "D1" received in the cycle "#2" subsequent to the previous write cycle has been held in the data input register (not shown).

As will be obviously understood from the above description, the points of difference in the circuit of FIG. 3 from the circuit of FIG. 1 are:

1) the middle register 103 is provided between the read address register 101 and the write address register 102.

2) the middle register 103 is operated only in the write cycle, and the read address register 101 and the write address register 102 are controlled every cycle by the same clock signal which isn't formed by obtaining the AND result from a non-clock system signal. An effect peculiar to the circuit of FIG. 3 that a variation in the timings of generation of the read and write address signals is suppressed and the operation can be executed at a high speed.

Figure 5:
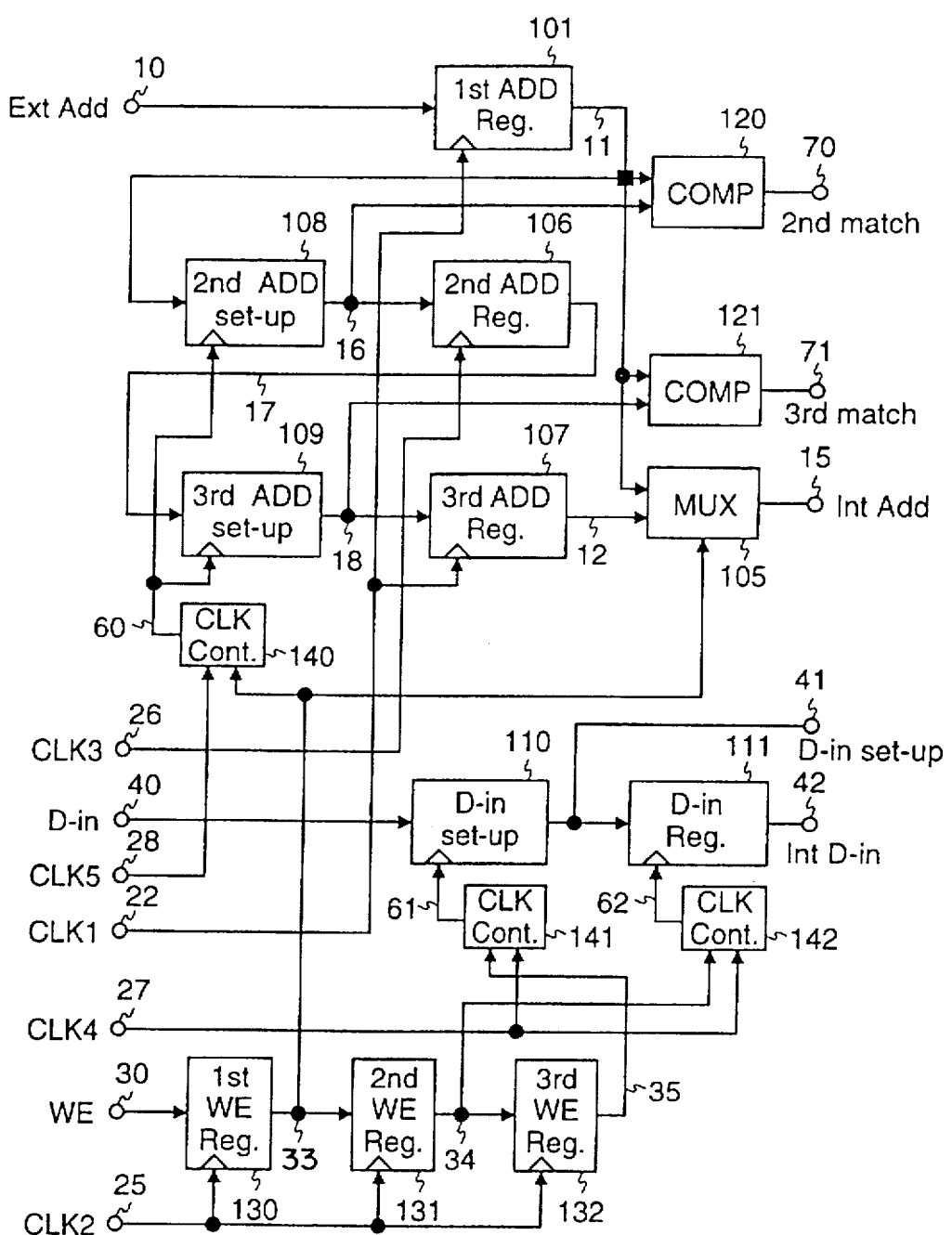
FIG. 5 is a block diagram of an address signal and write data control circuit according to the invention using the late-write method.

FIG. 5 shows a block diagram of an embodiment of an address signal and write data control circuit on a chip, which provides a 2-hierarchy late-write function, according to the invention, and which eliminates a dead cycle.

The address signal 10 (Ext ADD) from the outside is supplied to the read address register 101 (1st ADD Reg.) through an input buffer (not shown). The output 11 (read address) of the read address register 101 is supplied to one input terminal of the address selection circuit 105 (MUX), an address input terminal of a 2nd address set-up circuit 108, and one address input terminal of each of two sets of address comparison circuits 120 and 121 (COMP). The write address 12 is inputted to the other address terminal of the address selection circuit 105 from the output of read address register 101 via a 2nd address set-up circuit 108, a 2nd address register 106, a 3rd address set-up circuit 109, and a 3rd address register 107. An output address signal 16 of the 2nd address set-up circuit 108 and an output address signal 18 of the 3rd address set-up circuit 109 are inputted to respective ones of the other address input terminals of the address comparison circuits 120 and 121 (COMP). Both of the 1st address register 101 and the 3rd address register 107 are controlled by a clock signal CLK1 for controlling receipt of data interlockingly with a leading edge of an external clock signal. Similarly, the 2nd address register 106 is controlled by a clock signal CLK3 for controlling the receipt of data interlockingly with the leading edge of the external clock signal. On the other hand, the 2nd address set-up circuit 108 and the 3rd address set-up circuit 109 are controlled by a clock system signal 60 for controlling the receipt of data interlockingly with the trailing edge of the external clock signal. The clock signal 60 represents the AND result between the write enable system signal 33 and a clock signal CLK5 by a clock control circuit 140 and generates a pulse every write cycle.

Write data 40 (D-in) is inputted to a data input set-up circuit 110 through an input buffer (not shown) and is further supplied as data for write control to the inside through a data input register 111. The write data set-up circuit 110 is controlled by a clock system signal 61 so as to receive data in a cycle which is two cycles after the write cycle. The write data input register 111 is controlled by a clock system signal 62 so as to receive an output signal of the data input set-up circuit 110 in a cycle after one cycle of the write cycle (after the completion of the writing). A write enable (WE) system signal is held in the chip by three stages of registers. A WE system clock signal 33, as an output of a WE register 130 at the first stage, is used as a signal for judging whether the present cycle is a write cycle or a read cycle for control of the address set-up circuit or the address selection circuit. A WE system clock signal 34 as an output of a WE register 131 at the second stage is used as a signal for judging whether the previous cycle was a write cycle or not for control of updating the write data. A WE system clock signal 35 as an output of a WE register 132 at the third stage is used as a signal for judging whether the present cycle is a cycle which is two cycles after the write cycle or not for control of supplying data to the write data set-up circuit 110.

Figure 6:
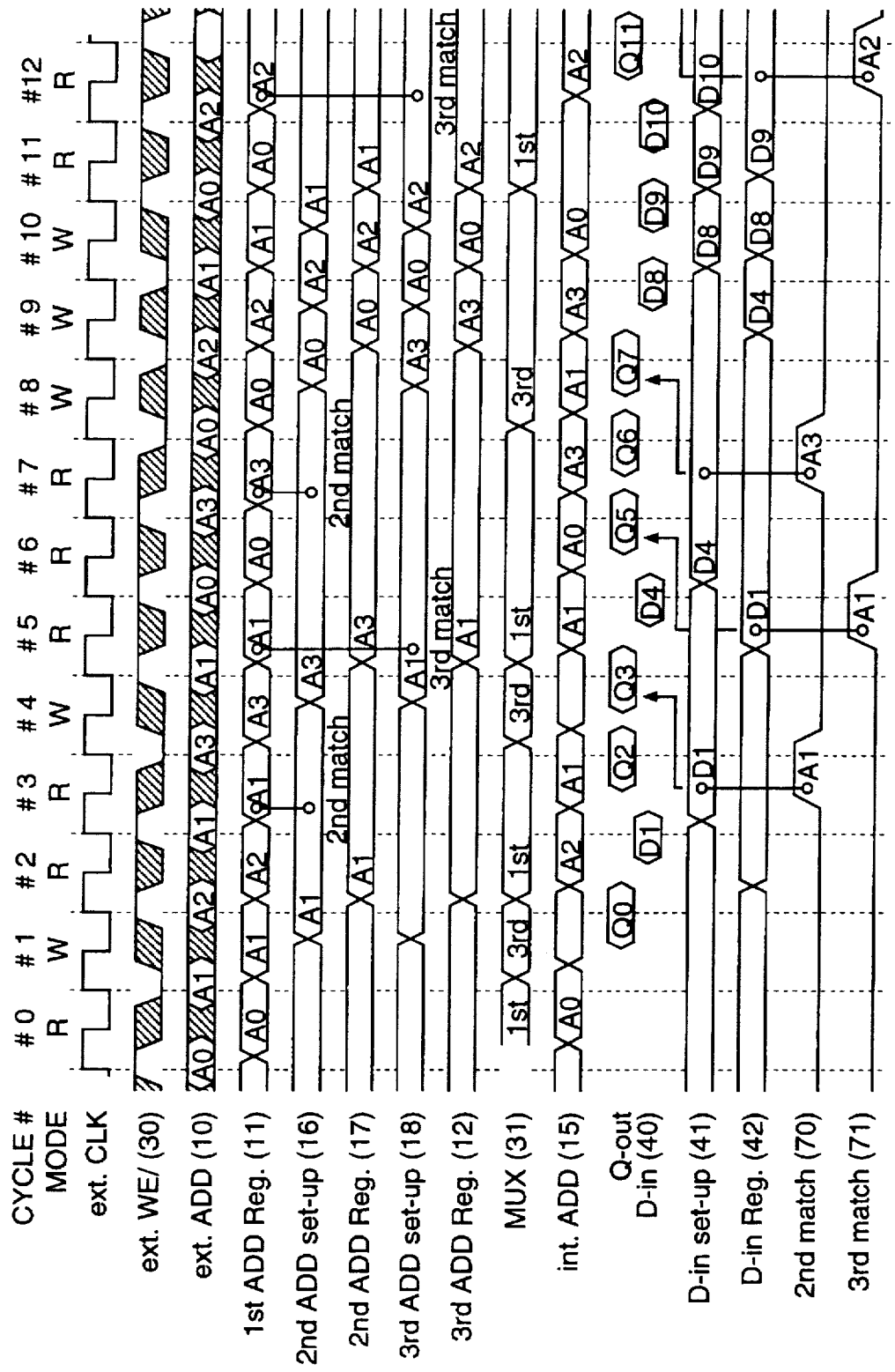
FIG. 6 is a timing chart for explaining the operation of FIG. 5.

FIG. 6 is a timing chart for explaining the operation of FIG. 5, and a flow of the address signal or write data will be described with reference thereto.

The cycle "0#" is a read cycle. The 1st address register 101 receives the address signal "A0" early in the cycle "0#". The read address 11 (1st ADD Reg output) is selected as an internal address 15 by a control signal MUX of the address selection circuit 105. The data of the memory cell selected by the read address 11 is outputted to an input/output terminal (D-in/Q-out) during a period of time from the middle of the next cycle "#1" to the middle of the second cycle "#2".

The cycle "#1" is a write cycle. The 1st address register 101 receives the write address signal "A1" early in the cycle "#1". The write address signal "A1" is transferred to the 2nd address set-up circuit 108 in the latter half of the cycle and an output signal 17 of the 2nd address register 106 is also transferred to the 3rd address set-up circuit 109. Since the 2nd and 3rd address registers are controlled so as to receive the data in the set-up circuit at the previous stage every cycle, the address data is updated every cycle, which is subsequent to the write cycle as a result. The data is actually written to the address received in the write cycle which is two cycles before the present cycle. The write data for the address received in the cycle is received by the write data input set-up circuit in the cycle "#3" which is after two cycles. The write data is written into the memory cell in a second write cycle "#8". Further, when the write address "A1" is selected before the completion of the writing to the memory cell, a result of coincidence (2nd match or 3rd match) can be obtained by either one of comparison between a 2nd address set-up output 16 and the 1st address register output 11 and comparison between a 3rd address set-up output 18 and the 1st address register output 11, so that data 41 of the data set-up circuit or data 42 of the data input register 42 is outputted. Other cycles will be understood by the drawing.

According to the example as mentioned above, since it is unnecessary to provide a dead cycle between the write cycle and the read cycle, 100% of the memory accessing efficiency can be obtained.

Figure 7:
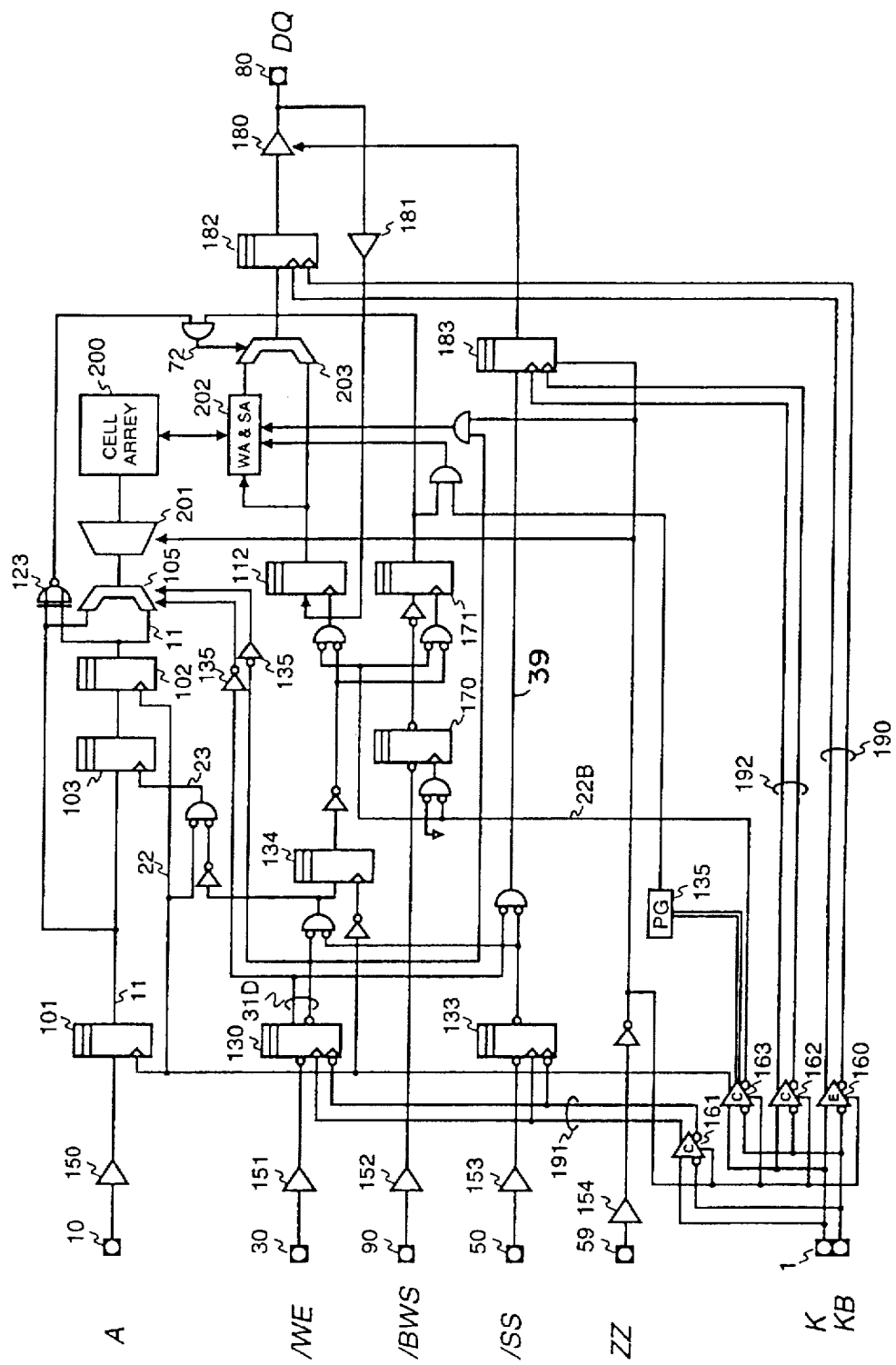
FIG. 7 is a schematic block diagram of the circuit of the invention as applied to a synchronous SRAM.

FIG. 7 shows a block diagram of a schematic construction of a synchronous SRAM such that the late-write function of the invention is realized on a chip. Reference numeral 10(A) denotes an address input terminal; 30 (/WE) a write enable bar input terminal; 90 (/BWS) a byte write selection signal input terminal; 50 (/SS) a synchronous selection signal input terminal; 59 (ZZ) a stand-by mode control signal input terminal; 1 (K/KB) an outer clock signal input terminal; 80 (DQ) an input/output terminal of data; 150 an input buffer for the address signal; 151 an input buffer for the write enable signal; 152 an input buffer for the byte write selection signal; 153 an input buffer for the synchronous selection signal; and 154 an output buffer for a stand-by mode control.

In the embodiment, the outer clock signal is inputted to four sets of clock buffers to produce a fan out of the internal clock signal, thereby processing the clock signal at a high speed. The clock buffers include a clock buffer 160 for controlling an output register 182; a clock buffer 161 for controlling the write enable (WE) register 130 and a synchronous selection (SS) register 133; a clock buffer 161 for controlling a register 183 for data output control (DOC); and a clock buffer 163 for controlling an address and write data and the like. The external clock signal is received at a pseudo ECL (PECL) level and is used inside by converting the PECL level to a CMOS level, except for a part of the clock signal. Since a register having an ECL construction is used as an output register 182 in this example, a buffer circuit having an ECL construction is used as a clock buffer 160 for the output register control, thereby processing the clock signal at a high speed. A clock signal 191 of a WE & SS system and a clock signal 192 of a DOC system are complementarily outputted to suppress unbalance of leading/trailing edges of the register output.

A control system will now be described. Signals of the control system are the write enable (WE) system signal, byte write selection (BWS) system signal, synchronous selection (SS) system signal, and standby mode control (ZZ) signal. In this case, only the ZZ signal is an asynchronous signal and other control system signals are synchronous signals. The registers receive the signals every cycle. A register has two stages only for the BWS system signal. A BWS register 171 at the second stage receives an output signal of a 1st BWS register 170 at the front stage only in a cycle subsequent to the write cycle. Consequently, in a cycle of the data writing to the memory cell, it can be judged whether the byte is a write selection or not and a control can be executed. In the WE system control, first of all, whether writing or reading has been selected is judged by an output 31D of the WE register 130 and the address selection circuit 105 is controlled at a high speed. For this purpose, only a middle buffer 135 is provided between the WE register 130 and the address selection circuit 105 without providing a circuit for obtaining the AND result, thereby executing the address selection at a high speed. A WES register 134 uses a signal (indicative of an active write cycle) formed by obtaining the AND result between WE and SS as an input signal and receives data interlockingly with a trailing edge of the clock signal. A write data input register 112 and the 2nd BWS register 171 receive a signal formed by obtaining the AND result between an output signal of the WES register 134 and a negative clock signal 22B of the clock buffer 163 only in a cycle subsequent to the write cycle. A WE.SSB system signal 39 for judging whether a cycle is an active read cycle or not, obtained by the AND result between an output of the WE register 130 and an output of the SS register 133, is supplied to a DOC register 183. That is, a control signal for judging whether an previous cycle is the active read cycle or not is set up as an input of the DOC register 183. An output buffer 180 is controlled to be enabled or disabled by the clock signal 192 for the DOC register. The DOC register 183 can also control the output buffer 180 by means of the asynchronous ZZ signal.

Since control regarding the address in this embodiment is substantially the same as that in the example of FIG. 3, the description is omitted here. An inner address controlled by the address selection circuit 105 is decoded by a decoder 201. A write amplifier and sense amplifier 202 reads and writes data from/to a memory cell selected in a memory cell array 200. An output data selection circuit 203 is controlled by a (match) signal 72 formed by obtaining the AND result between the address comparison circuit 123 and the 2nd BWS register 171. The address comparison circuit 123 compares the output 11 of the 1st address (read address) register 101 and the output 12 of the 2nd address (write address) register 102. When the two addresses coincide, since data is not written to the memory cell yet, the write data received by the data input register is selected by the output data selection circuit 203 and is transferred to the output register.

As will be obviously understood from the above description, an SRAM in which the late-write function is executed on the chip can be realized by the construction schematically shown in FIG. 7.

Figure 8:
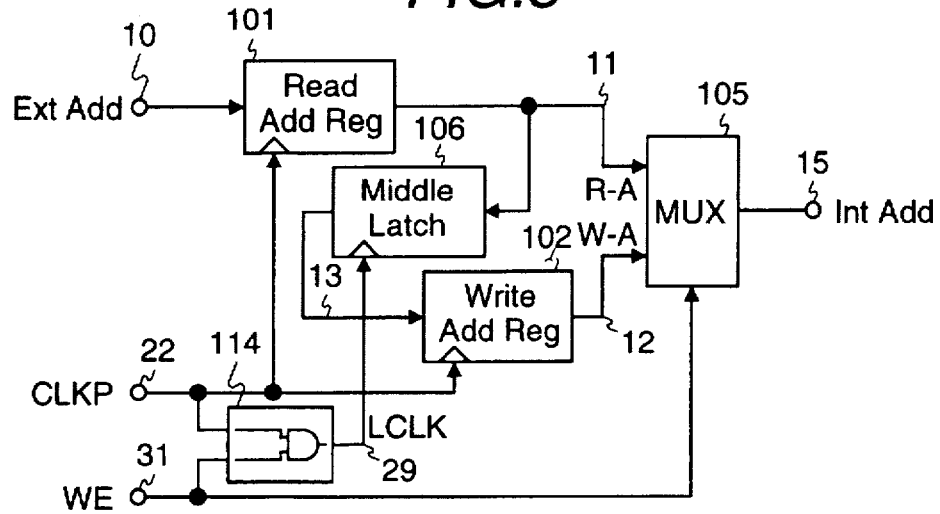
FIG. 8 is a block diagram of an address signal control circuit according to the invention using the late-write method.
Figure 9:
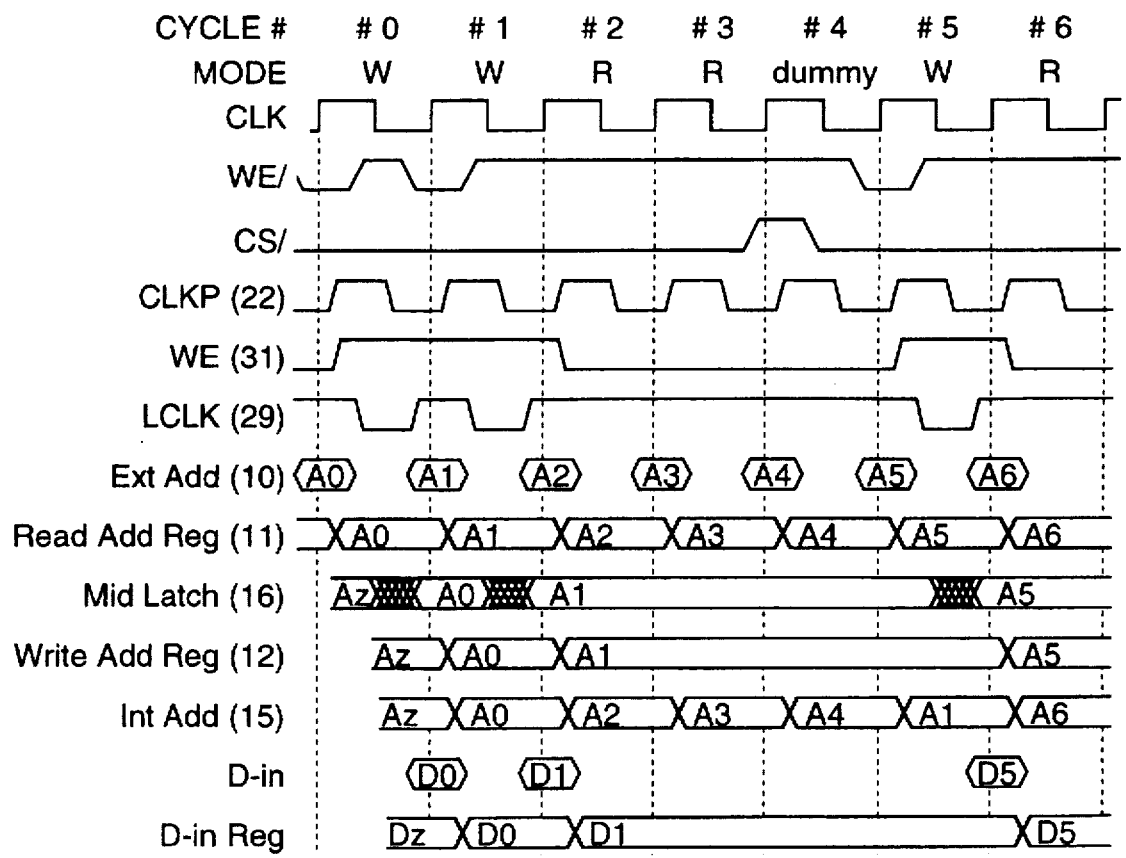
FIG. 9 is a timing chart for showing the operation of FIG. 8.

FIG. 8 shows a block diagram of an example of an address signal control circuit to realize the late-write function of the invention on a chip. FIG. 9 shows a timing chart of the internal operation. In the example of FIG. 8, the middle register 103 in the circuit of FIG. 3 is changed to a middle latch 106 and a signal system 29 for controlling the middle latch is different from the previous circuit. According to FIG. 8, the middle latch 106 is controlled for a period of time from the latter half of a write cycle to the former half of the next write cycle, thereby setting up a write address latched in the previous write cycle as an input to the write register 102 early in the write cycle. Since latch means can be constructed easier as compared with register means, the circuit can be simplified.

Figure 10:
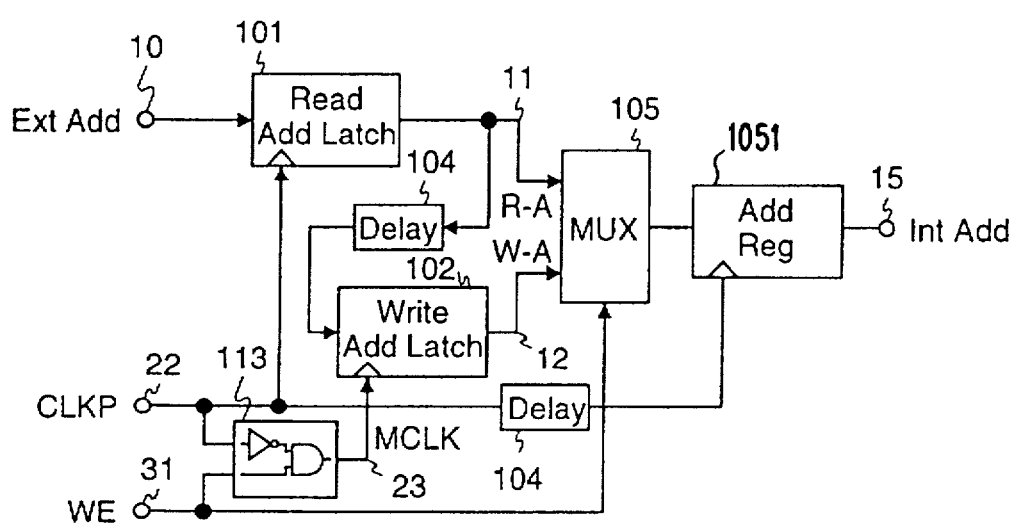
FIG. 10 is a block diagram of an address signal control circuit according to the invention using the late-write method.

FIG. 10 shows a block diagram of another example of an address signal control circuit to realize the late-write function on a chip. In FIG. 10, reference number 10 depicts an external input address signal which is input to read address latch 101. Read address latch 101 is controlled by internal clock signal (CLKP) 22. An output from 101 is a read address signal (R-A) 11 which is transferred to selection circuit (MUX) 105 and to write address latch 102 via a delay circuit 104. Write address latch 102 is controlled by a clock signal (MCLK) 23 which is a value of an AND logic operation between the phase insert signal of an internal clock signal 22 and write enable signal (WF) 31. A write address signal (W-A) 12 from the write address latch is transferred to selection circuit 105. The selection circuit 105 is enabled by write enable signal (WE) 31 to select read address signal 11 at a read cycle and write address signal 12 at a write cycle to output it as internal address signal 15. The embodiment is largely different from the other embodiments from the point of view that an address register circuit 1051 is provided after the address selection circuit. Although a latch circuit having a circuit construction which is simple is also provided to hold the read and write addresses, the latch circuit merely represents a specific example of a holding means, and so a register circuit or the like can be also employed for this purpose. Since only one set of registers is necessary in this circuit, there is an advantage that the circuit construction can be simplified.

According to the invention, as will be obviously understood from the above description, a control wherein the address in the write cycle for the late-write function is held until the next write cycle and the read address and the write address are switched in response to the write enable signal can be executed.

Three sets of registers are provided and the read and write registers are controlled by the same clock signal, thereby controlling the inner address at a high speed.

Further, by using the two-hierarchy late-write feature, the dead cycle is eliminated, so that the accessing efficiency can be improved.

What is claimed is:

1. A semiconductor memory which inputs and outputs addresses and data in synchronism with a reference clock signal, comprising:

address hold means including (n) stages for holding addresses therein; and control means for shifting a first address being held in a first stage of the address hold means, which address is fetched from an external source, at a first write cycle to a succeeding second stage of the address holding means at a second write cycle.

2. A semiconductor memory which inputs and outputs addresses and data in synchronism with a reference clock signal, comprising control means for controlling a fetch timing for fetching a write data corresponding to a write address to be delayed two cycles or more relative to a timing of a reference clock signal at which said write address was fetched.

3. A semiconductor memory which inputs and outputs addresses and data in synchronism with a reference clock signal, comprising:

read address hold means for holding a read address;

write address hold means for holding a write address;

write address set up means for setting up an output from said read address hold means as an input to said write address hold means at every write cycle, said set up means being disposed between said read address hold means and said write address holding means; and address select means for selecting said output from said read address hold means at a read cycle of the memory and said output from said write address hold means at a write cycle of the memory.

4. A semiconductor memory according to claim 3, wherein said write address set up means comprises a delay circuit.

5. A semiconductor memory according to claim 3, wherein said write address set up means comprises a latch circuit which controls set up operation at a signal level of a control signal for controlling said write address set up means.

6. A semiconductor memory according to claim 3, where said write address set up means comprises a register circuit which controls a timing of set up operation at an edge of a control signal which controls said write address set up means.

* * * * *